(12) United States Patent
Hung et al.

(10) Patent No.: US 10,535,817 B1
(45) Date of Patent: Jan. 14, 2020

(54) METHOD OF MANUFACTURING EMBEDDED MAGNETORESISTIVE RANDOM ACCESS MEMORY

(71) Applicant: United Microelectronics Corp., Hsinchu (TW)

(72) Inventors: Ching-Wen Hung, Tainan (TW); Kun-Ju Li, Tainan (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 16/144,888

(22) Filed: Sep. 27, 2018

(30) Foreign Application Priority Data

Sep. 7, 2018 (CN) .......................... 2018 1 1050528

(51) Int. Cl.
| | |
|---|---|
| *H01L 43/12* | (2006.01) |
| *H01L 27/22* | (2006.01) |
| *H01L 43/02* | (2006.01) |
| *H01L 43/10* | (2006.01) |
| *H01L 43/08* | (2006.01) |

(52) U.S. Cl.
CPC ............ *H01L 43/12* (2013.01); *H01L 27/222* (2013.01); *H01L 43/02* (2013.01); *H01L 43/08* (2013.01); *H01L 43/10* (2013.01)

(58) Field of Classification Search
CPC ........... G11C 2211/5615; G11C 11/161; H01L 43/08; H01L 43/12
See application file for complete search history.

(56) References Cited

U.S. PATENT DOCUMENTS

| | | | |
|---|---|---|---|
| 7,166,506 B2 | 1/2007 | Prince et al. | |
| 9,818,935 B2 | 11/2017 | Chuang et al. | |
| 2012/0028373 A1* | 2/2012 | Belen | H01L 43/12 438/3 |
| 2012/0070972 A1 | 3/2012 | Chen et al. | |
| 2015/0325622 A1* | 11/2015 | Zhang | H01L 43/12 257/421 |
| 2016/0111642 A1* | 4/2016 | Perniola | G11C 11/005 257/2 |
| 2016/0141489 A1* | 5/2016 | Zhang | H01L 43/02 257/421 |
| 2016/0308119 A1* | 10/2016 | Hsu | H01L 43/08 |

* cited by examiner

*Primary Examiner* — Dale E Page
*Assistant Examiner* — Wilner Jean Baptiste
(74) *Attorney, Agent, or Firm* — J.C. Patents (57) ABSTRACT

A method of manufacturing an embedded magnetoresistive random access memory including the following steps is provided. A memory cell stack structure is formed on a substrate structure. The memory cell stack structure includes a first electrode, a second electrode, and a magnetic tunnel junction structure. A first dielectric layer covering the memory cell stack structure is formed. A metal nitride layer is formed on the first dielectric layer. A second dielectric layer is formed on the metal nitride layer. A first CMP process is performed on the second dielectric layer to expose the metal nitride layer by using the metal nitride layer as a stop layer. An etch back process is performed to completely remove the metal nitride layer and expose the first dielectric layer. A second CMP process is performed to expose the second electrode. The manufacturing method can have a better planarization effect.

16 Claims, 6 Drawing Sheets

METHOD OF MANUFACTURING EMBEDDED MAGNETORESISTIVE RANDOM ACCESS MEMORY

CROSS-REFERENCE TO RELATED APPLICATION

This application claims the priority benefit of China application serial no. 201811050528.4, filed on Sep. 7, 2018. The entirety of the above-mentioned patent application is hereby incorporated by reference herein and made a part of this specification.

BACKGROUND OF THE INVENTION

Field of the Invention

The invention relates to a method of manufacturing a semiconductor structure, and particularly relates to a method of manufacturing an embedded magnetoresistive random access memory (eMRAM).

Description of Related Art

The chip used in the internet of things (IOT) terminal apparatus may include device regions with different functions, such as an embedded memory region, a logic device region, a radio frequency (RF) device region, and a static random access memory (SRAM) region etc.

In the case of using the eMRAM as the embedded memory in the chip, the memory cell stack structure of the eMRAM is formed in the embedded memory region, and the area occupied by the embedded memory region on the wafer is small, so that the dielectric layer subsequently formed on the memory cell stack structure creates a large step height difference between the embedded memory region and other regions. Therefore, after the dielectric layer is planarized by the chemical mechanical polishing (CMP) method, serious dishing occurs, and the planarization effect is impaired.

SUMMARY OF THE INVENTION

The invention provides a method of manufacturing an eMRAM, which can have a better planarization effect.

The invention provides a method of manufacturing an eMRAM, which includes the following steps. A memory cell stack structure is formed on a substrate structure. The memory cell stack structure includes a first electrode, a second electrode, and a magnetic tunnel junction (MTJ) structure. The first electrode is located on the substrate structure. The second electrode is located on the first electrode. The MTJ structure is located between the first electrode and the second electrode. A first dielectric layer covering the memory cell stack structure is formed. A metal nitride layer is formed on the first dielectric layer. A second dielectric layer is formed on the metal nitride layer. A first CMP process is performed on the second dielectric layer to expose the metal nitride layer by using the metal nitride layer as a stop layer. An etch back process is performed to completely remove the metal nitride layer and expose the first dielectric layer. A second CMP process is performed to expose the second electrode.

According to an embodiment of the invention, in the method of manufacturing the eMRAM, the etch back process is, for example, a dry etching process with no selectivity.

According to an embodiment of the invention, in the method of manufacturing the eMRAM, the memory cell stack structure may further include a seed layer. The seed layer is located between the first electrode and the MTJ structure.

According to an embodiment of the invention, in the method of manufacturing the eMRAM, the memory cell stack structure may further include a barrier layer. The barrier layer is located between the first electrode and the substrate structure.

According to an embodiment of the invention, the method of manufacturing the eMRAM may further include forming a passivation layer covering the memory cell stack structure before forming the first dielectric layer.

According to an embodiment of the invention, in the method of manufacturing the eMRAM, the dielectric constant of the first dielectric layer and the dielectric constant of the second dielectric layer may be different.

According to an embodiment of the invention, in the method of manufacturing the eMRAM, the dielectric constant of the first dielectric layer and the dielectric constant of the second dielectric layer may be the same.

According to an embodiment of the invention, in the method of manufacturing the eMRAM, the material of the first dielectric layer is, for example, an ultra-low dielectric constant (ultra low-k, ULK) material.

According to an embodiment of the invention, in the method of manufacturing the eMRAM, the material of the metal nitride layer is, for example, titanium nitride (TiN) or tantalum nitride (TaN).

According to an embodiment of the invention, in the method of manufacturing the eMRAM, the material of the second dielectric layer is, for example, a tetraethoxysilane (TEOS) oxide.

According to an embodiment of the invention, the method of manufacturing the eMRAM may further include performing a wet cleaning process after performing the first CMP process and before performing the etch back process.

According to an embodiment of the invention, in the method of manufacturing the eMRAM, the cleaning solution of the wet cleaning process is, for example, ultra-dilute hydrofluoric acid (UDHF).

According to an embodiment of the invention, the method of manufacturing the eMRAM may further include performing a wet cleaning process after performing the etch back process.

According to an embodiment of the invention, in the method of manufacturing the eMRAM, the cleaning solution of the wet cleaning process is, for example, UDHF.

According to an embodiment of the invention, in the method of manufacturing the eMRAM, an embedded memory region and a device region adjacent to each other may be defined in the substrate structure. The memory cell stack structure may be located in the embedded memory region.

According to an embodiment of the invention, in the method of manufacturing the eMRAM, before performing the first CMP process, the height of the first dielectric layer in the embedded memory region may be higher than the height of the first dielectric layer in the device region, the height of the metal nitride layer in the embedded memory region may be higher than the height of the metal nitride layer in the device region, and the height of the second dielectric layer in the embedded memory region may be higher than the height of the second dielectric layer in the device region.

According to an embodiment of the invention, in the method of manufacturing the eMRAM, after performing the first CMP process, the height of the metal nitride layer in the embedded memory region may be higher than the height of the metal nitride layer in the device region, the metal nitride layer in the embedded memory region may be exposed, and a portion of the second dielectric layer may remain on the metal nitride layer in the device region.

According to an embodiment of the invention, in the method of manufacturing the eMRAM, the etch back process may further remove the second dielectric layer remaining on the metal nitride layer and further remove a portion of the first dielectric layer.

According to an embodiment of the invention, in the method of manufacturing the eMRAM, after performing the etch back process, the height of the first dielectric layer in the embedded memory region and the height of the first dielectric layer in the device region may be the same.

According to an embodiment of the invention, in the method of manufacturing the eMRAM, after performing the second CMP process, the height of the first dielectric layer in the embedded memory region and the height of the first dielectric layer in the device region may be the same.

Based on the above, in the method of manufacturing the eMRAM according to the invention, the first CMP process is performed by using the metal nitride layer as the stop layer, the etch back process for exposing the first dielectric layer is performed, and the second CMP process for exposing the second electrode is performed, so that the manufacturing method of the eMRAM can have a better planarization effect.

In order to make the aforementioned and other objects, features and advantages of the invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

FIG. 1A to FIG. 1F are cross-sectional views illustrating a manufacturing process of an eMRAM according to an embodiment of the invention.

Figure 1A:
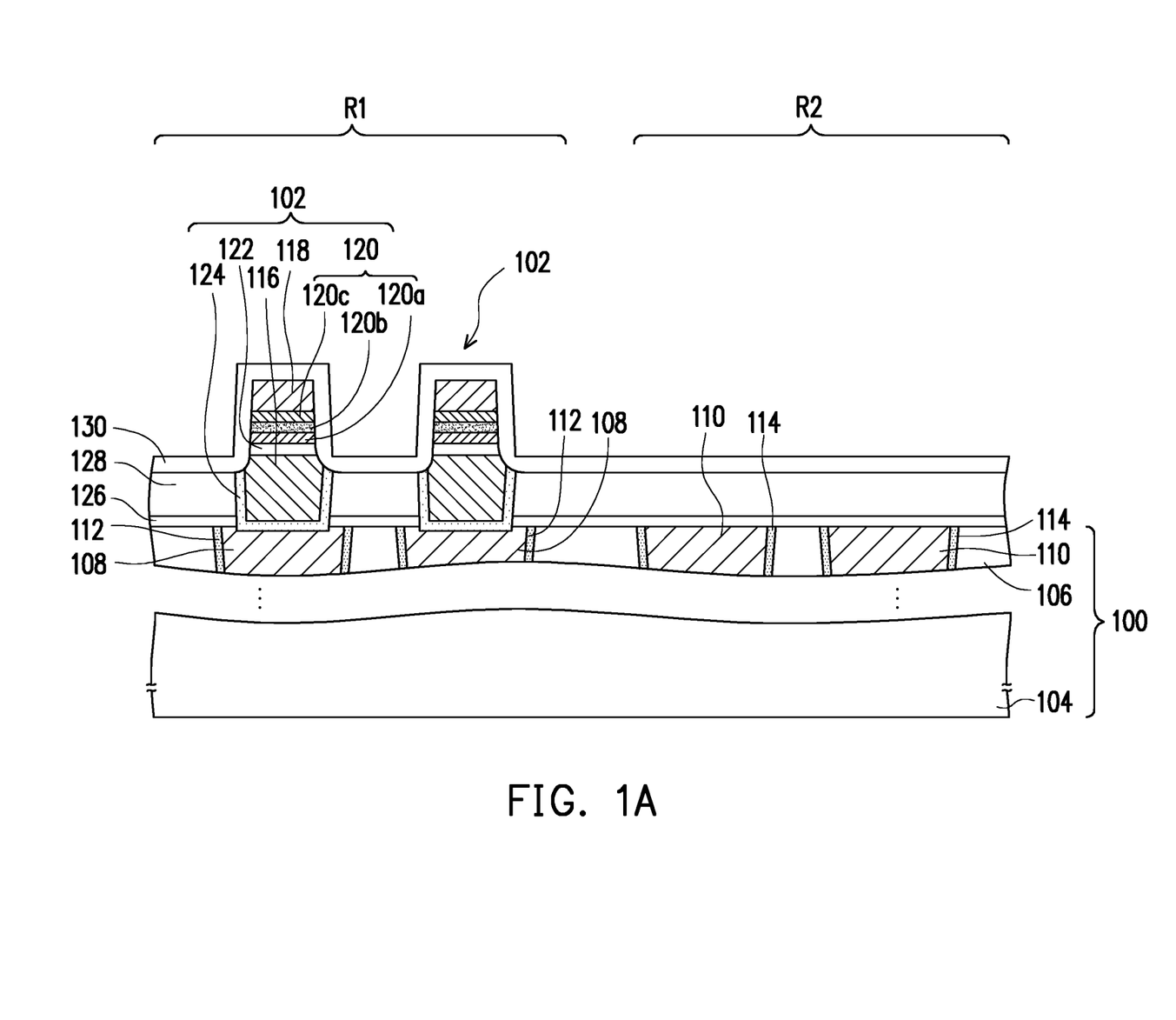
FIG. 1A to FIG. 1F are cross-sectional views illustrating a manufacturing process of an eMRAM according to an embodiment of the invention.

Referring to FIG. 1A, a memory cell stack structure 102 is formed on a substrate structure 100. An embedded memory region R1 and a device region R2 adjacent to each other may be defined in the substrate structure 100. The device region R2 is, for example, a logic device region, a RF device region, or a SRAM region. In the present embodiment, the device region R2 is exemplified by the logic device region, but the invention is not limited thereto.

The substrate structure 100 may include a substrate 104. The substrate 104 may be a semiconductor substrate, such as a silicon substrate. Furthermore, the desired doped region (not shown) and/or the desired semiconductor device (not shown) may be formed in the substrate 104 according to product requirements. In FIG. 1A, the substrate 104 is depicted as a single-layer structure to simplify the description. In addition, the substrate structure 100 may further include desired components, such as the semiconductor device, the dielectric layer, and/or the interconnect structure according to product requirements. For example, the substrate structure 100 may further include at least one of the dielectric layer 106, the conductive layer 108, the conductive layer 110, the barrier layer 112, and the barrier layer 114, but the invention is not limited thereto. The conductive layer 108, the conductive layer 110, the barrier layer 112, and the barrier layer 114 may function as the interconnect structure. The dielectric layer 106 is located on the substrate 104. The material of the dielectric layer 106 is, for example, silicon oxide. The conductive layer 108 and the conductive layer 110 are respectively located in the dielectric layer 106 of the embedded memory region R1 and the device region R2. The material of conductive layer 108 and conductive layer 110 is, for example, copper, aluminum or tungsten. The barrier layer 112 is located between the dielectric layer 106 and the conductive layer 108. The barrier layer 114 is located between the dielectric layer 106 and the conductive layer 110. The material of the barrier layer 112 and the barrier layer 114 is, for example, titanium (Ti), titanium nitride (TiN), or a combination thereof.

The memory cell stack structure 102 may be located in the embedded memory region R1. The memory cell stack structure 102 includes an electrode 116, an electrode 118 and a MTJ structure 120 and may further include at least one of the seed layer 122 and the barrier layer 124. The electrode 116 is located on the substrate structure 100. In the present embodiment, the electrode 116 is illustrated by being located on the conductive layer 108 as an example. The material of electrode 116 is, for example, tungsten (W). The electrode 118 is located on the electrode 116. The material of the electrode 118 is, for example, tantalum (Ta).

The MTJ structure 120 is located between the electrode 116 and the electrode 118. For example, the MTJ structure 120 may include a ferromagnetic layer 120a, a barrier layer 120b, and a ferromagnetic layer 120c sequentially disposed on the electrode 116. The barrier layer 120b separates the ferromagnetic layer 120a from the ferromagnetic layer 120c. The material of the ferromagnetic layer 120a is, for example, cobalt (Co), iron (Fe), boron (B), or a combination thereof. The material of the barrier layer 120b is, for example, a magnesium oxide, an aluminum oxide, or a combination thereof. The material of the ferromagnetic layer 120c is, for example, cobalt (Co), iron (Fe), boron (B), or a combination thereof.

In some embodiments, the lower ferromagnetic layer 120a may have a fixed or pinned magnetic orientation, while the upper ferromagnetic layer 120c may have a variable or free magnetic orientation, which can be switched between two or more distinct magnetic polarities that each may represent a different data state. In other embodiments, the MTJ structure 120 may be vertically flipped, such that the lower ferromagnetic layer may have a free magnetic orientation, while the upper ferromagnetic layer may have a pinned magnetic orientation. Although the MTJ structure 120 is described by the above-mentioned embodiment, the invention is not limited thereto. The person having ordinary skill in the art may adjust the structure of the MTJ structure 120 according to the product requirements.

The seed layer 122 is located between the electrode 116 and the MTJ structure 120. The material of the seed layer 122 is, for example, tantalum nitride (TaN). The barrier layer 124 is located between the electrode 116 and the substrate structure 100 and may be located between the electrode 116 and the dielectric layer 128. The material of the barrier layer 124 is, for example, titanium (Ti), titanium nitride (TiN), or a combination thereof.

Moreover, the method of manufacturing the MTJ structure 120 may include the following steps, but the invention is not limited thereto. The cap layer 126 and the dielectric layer 128 may be sequentially formed on the substrate structure 100. The material of the cap layer 126 is, for example, silicon carbonitride (SiCN). The method of forming the cap layer 126 is, for example, a chemical vapor deposition (CVD) method. The material of the dielectric layer 128 is, for example, silicon oxide. The method of forming the dielectric layer 128 is, for example, a CVD method. The barrier layer 124 and the electrode 116 may be formed in the cap layer 126 and the dielectric layer 128 by a metal interconnection process. A seed material layer (not shown), a MTJ material layer (not shown), and an electrode material layer (not shown) may be sequentially formed on the dielectric layer 128 and the electrode 116 by a deposition process. The seed material layer, the MTJ material layer, and the electrode material layer are patterned by a lithography process and an etching process to form the seed layer 122, the MTJ structure 120, and the electrode 118.

A passivation layer 130 covering the memory cell stack structure 102 may be formed. The material of the passivation layer 130 is, for example, silicon nitride. The method of forming the passivation layer 130 is, for example, a CVD method.

Figure 1B:
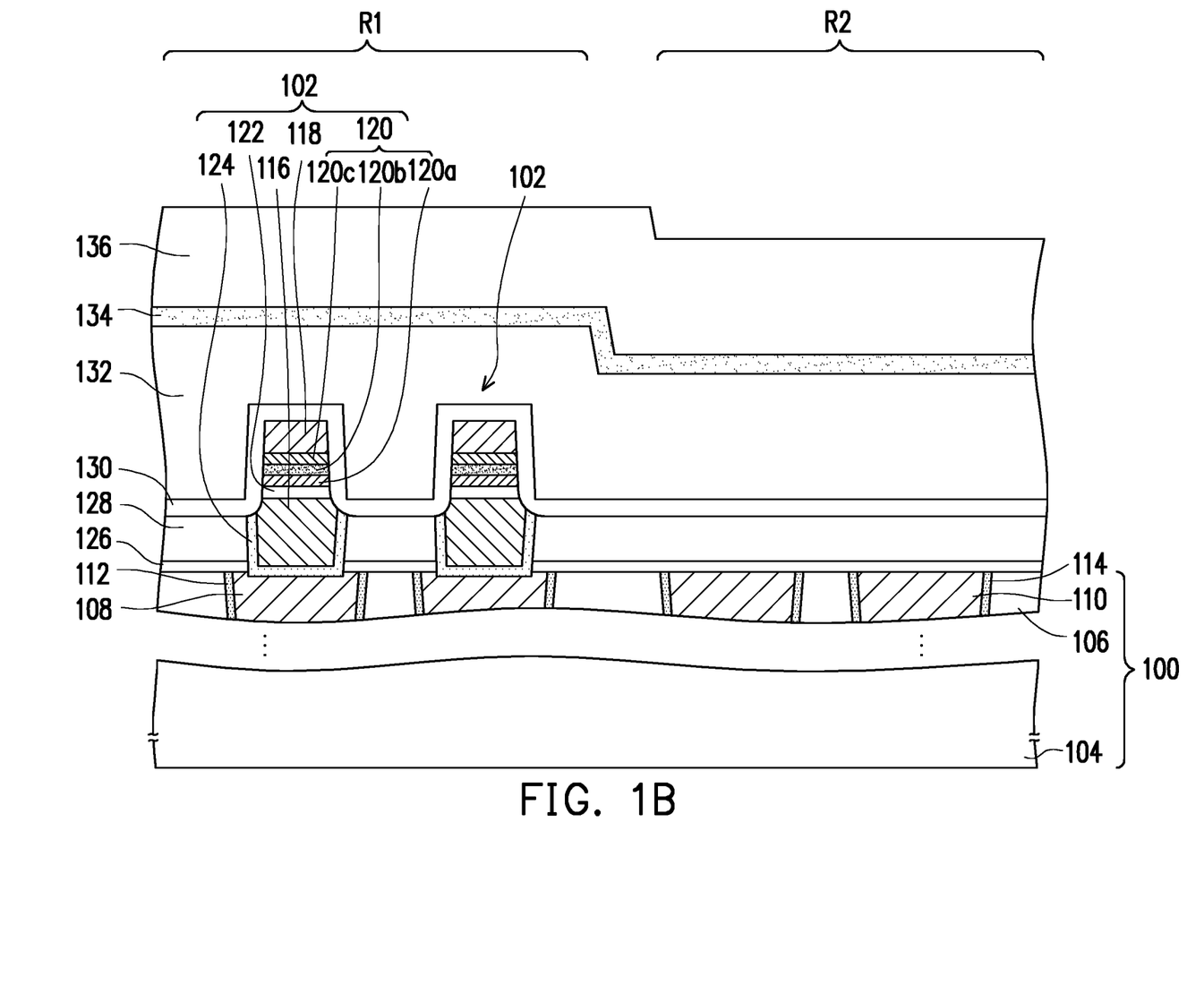

Referring to FIG. 1B, a dielectric layer 132 covering the memory cell stack structure 102 is formed. In the present embodiment, the dielectric layer 132 may be formed on the passivation layer 130, but the invention is not limited thereto. The material of the dielectric layer 132 is, for example, an ultra-low dielectric constant material (ULK) material. The method of forming the dielectric layer 132 is, for example, a CVD method.

A metal nitride layer 134 is formed on the dielectric layer 132. The material of the metal nitride layer 134 is, for example, titanium nitride (TiN) or tantalum nitride (TaN). The method of forming the metal nitride layer 134 is, for example, a CVD method or a physical vapor deposition (PVD) method.

A dielectric layer 136 is formed on the metal nitride layer 134. The dielectric constant of dielectric layer 132 and the dielectric constant of dielectric layer 136 may be different or the same. In the present embodiment, the dielectric constant of dielectric layer 132 and the dielectric constant of dielectric layer 136 are exemplified by being different. The material of the dielectric layer 136 is, for example, a tetraethoxysilane (TEOS) oxide. The method of forming the dielectric layer 136 is, for example, a CVD method.

Since the memory cell stack structure 102 is formed on the substrate structure 100 in the embedded memory region R1, the height of the dielectric layer 132 in the embedded memory region R1 may be higher than the height of the dielectric layer 132 in the device region R2, the height of the metal nitride layer 134 in embedded memory region R1 may be higher than the height of the metal nitride layer 134 in the device region R2, and the height of the dielectric layer 136 in the embedded memory region R1 may be higher than the height of the dielectric layer 136 in the device region R2.

Figure 1C:
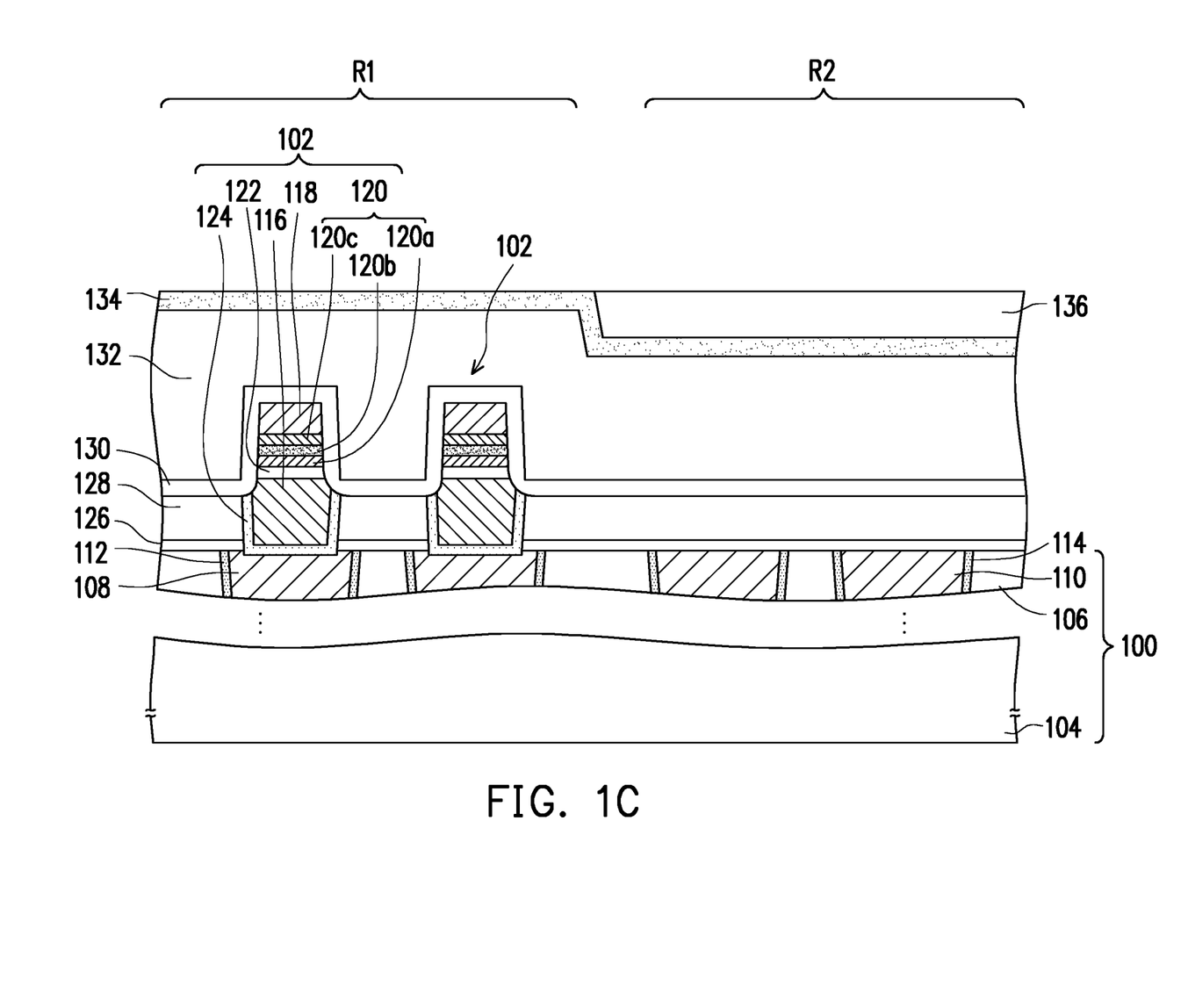

Referring to FIG. 1C, a first CMP process is performed on the dielectric layer 136 to expose the metal nitride layer 134 by using the metal nitride layer 134 as a stop layer. After performing the first CMP process, the height of the metal nitride layer 134 in the embedded memory region R1 may be higher than the height of the metal nitride layer 134 in the device region R2, the metal nitride layer 134 in the embedded memory region R1 may be exposed, and a portion of the dielectric layer 136 may remain on the metal nitride layer 134 in the device region R2. In addition, the height of the metal nitride layer 134 in the embedded memory region R1 and the height of the dielectric layer 136 remaining in the device region R2 may be the same. In the present embodiment, the word "the same" means "substantially the same", and the word "substantially" means that a slightly tolerance may be allowed to exist.

A wet cleaning process may be performed after performing the first CMP process and before performing the subsequent etch back process, so that the by-products (e.g., polymer) generated in the first CMP process can be removed. The cleaning solution of the wet cleaning process is, for example, ultra-dilute hydrofluoric acid (UDHF).

Figure 1D:
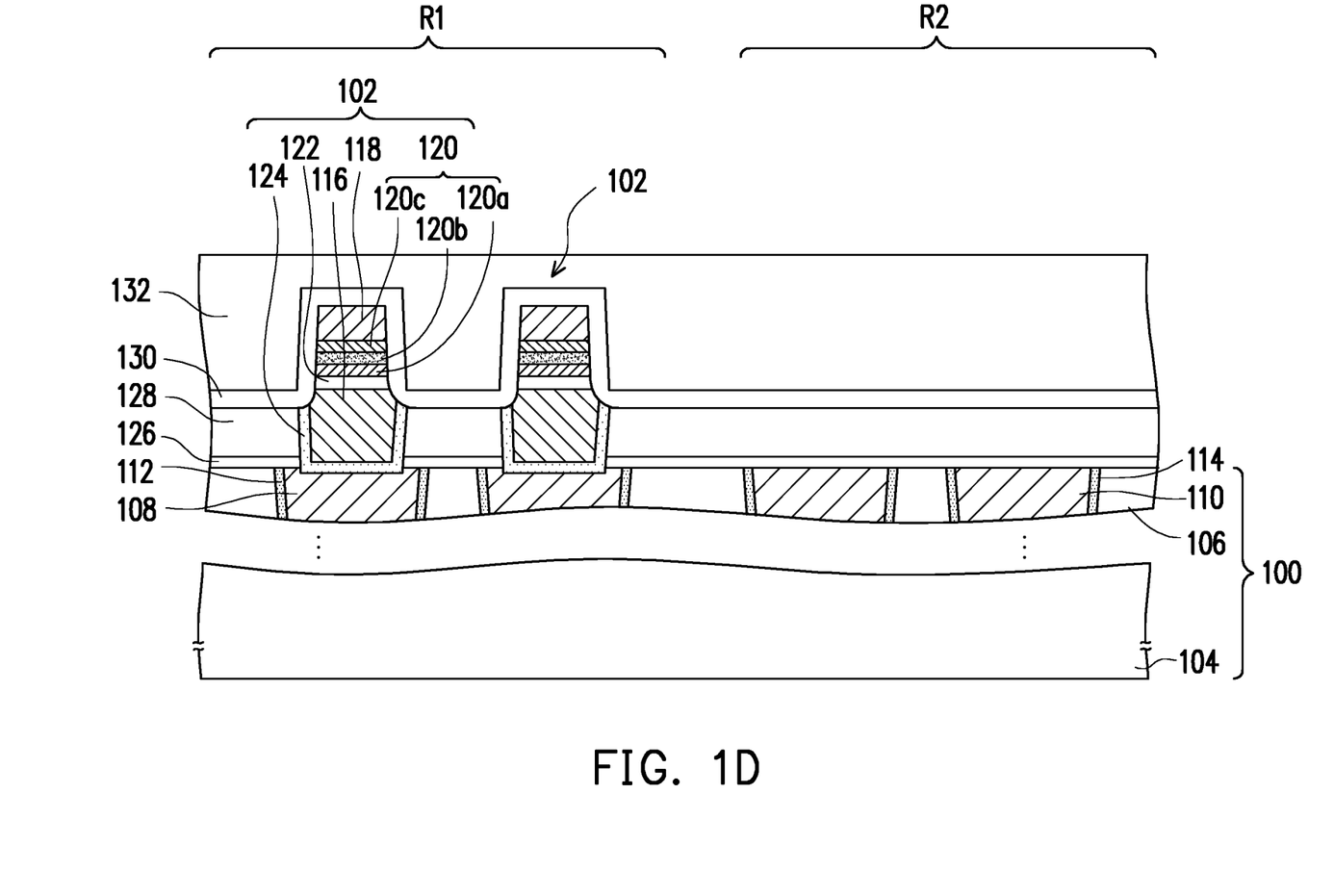

Referring to FIG. 1D, an etch back process is performed to completely remove the metal nitride layer 134 and expose the dielectric layer 132. The etch back process may further remove the dielectric layer 136 remaining on the metal nitride layer 134 and further remove a portion of the dielectric layer 132. After performing the etch back process, the height of the dielectric layer 132 in the embedded memory region R1 and the height of the dielectric layer 132 in the device region R2 may be the same. The etch back process is, for example, a dry etching process with no selectivity, wherein the dry etching process with no selectivity may have substantially the same removal rate for the metal nitride layer 134, the dielectric layer 136, and the dielectric layer 132.

In the present embodiment, after performing the etch back process, a portion of the dielectric layer 132 may remain above the memory cell stack structure 102. In other words, the dielectric layer 132 may cover the passivation layer 130 located above the memory cell stack structure 102, but the invention is not limited thereto. In another embodiment, the etch back process may remove the dielectric layer 132 located above the memory cell stack structure 102 to expose the passivation layer 130.

A wet cleaning process may be performed after performing the etch back process, so that the by-products (e.g., polymer) generated in the etch back process can be removed. The cleaning solution of the wet cleaning process is, for example, UDHF.

Figure 1E:
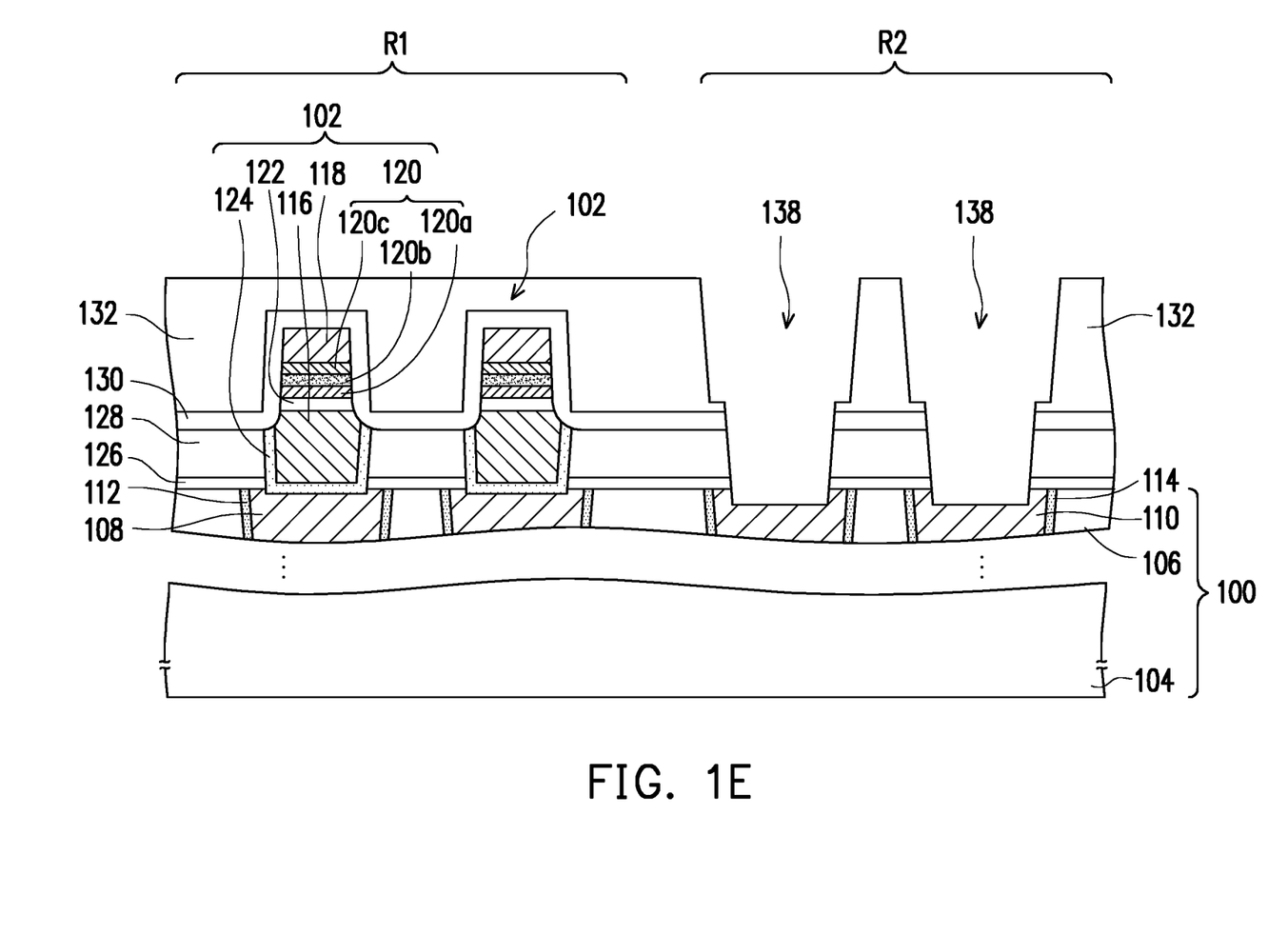

Referring to FIG. 1E, an opening 138 may be formed in the dielectric layer 132, the passivation layer 130, the dielectric layer 128, and the cap layer 126 of the device region R2. The opening 138 may expose conductive layer 110. The opening 138 is, for example, a dual damascene opening. The method of forming the opening 138 is, for example, patterning the dielectric layer 132 located in the device region R2 by a lithography process and an etching process.

Figure 1F:
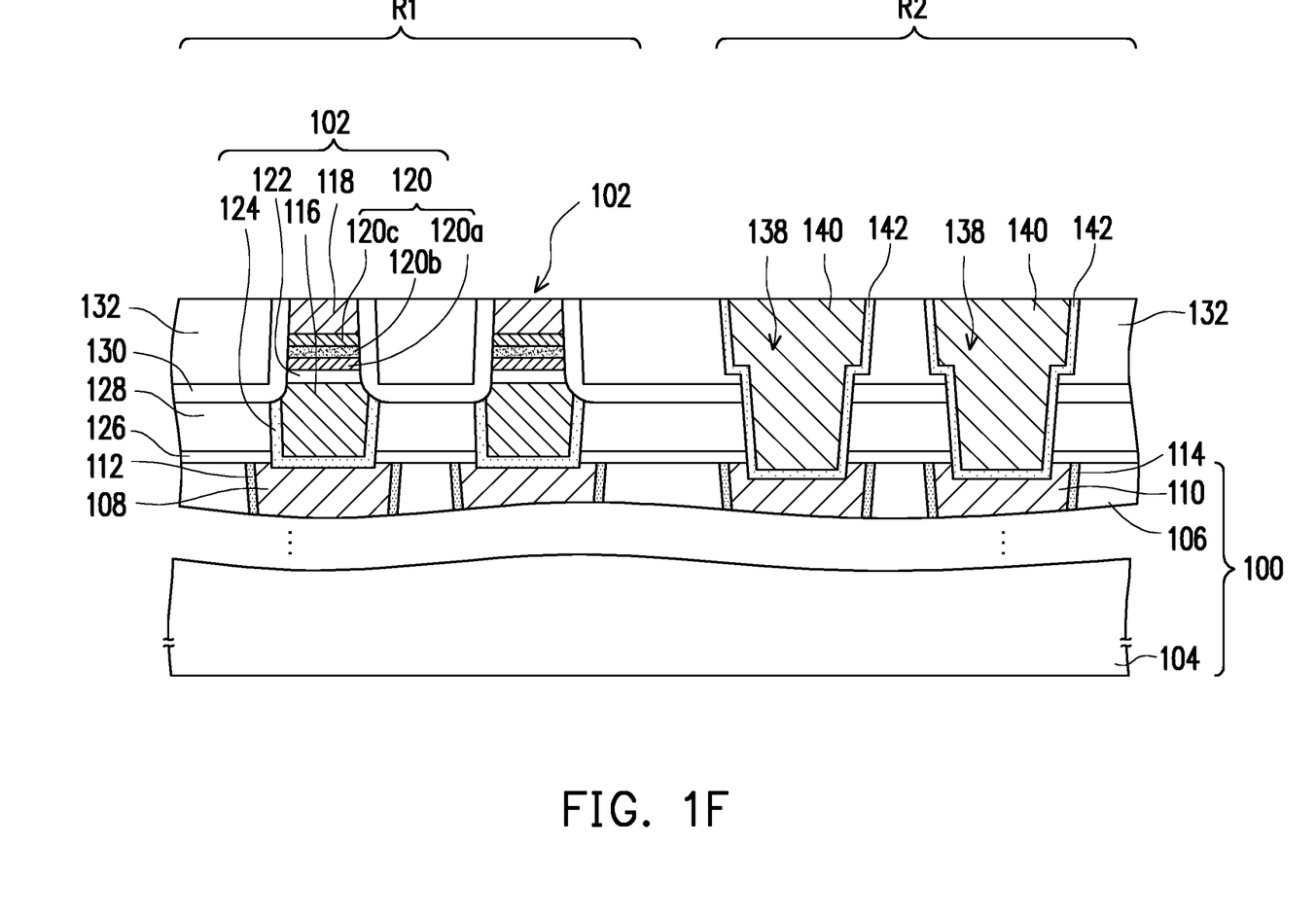

Referring to FIG. 1F, a conductive layer 140 may be formed in the opening 138. The material of the conductive layer 140 is, for example, copper, aluminum or tungsten. In addition, the barrier layer 142 may be formed on the surface of the opening 138 before forming the conductive layer 140. The material of the barrier layer 142 is, for example, titanium (Ti), titanium nitride (TiN), or a combination thereof. The method of forming the barrier layer 142 and the conductive layer 140 is, for example, sequentially forming a barrier material layer (not shown) and a conductive material layer (not shown) filling in the opening 138, and then performing an CMP process on the conductive material layer and the barrier material layer to remove the conductive material layer and the barrier material layer outside the opening 138, but the invention is not limited thereto.

Furthermore, a second CMP process is performed to expose electrode 118. Specifically, the second CMP process may be used to remove a portion of the dielectric layer 132 and a portion of the passivation layer 130, thereby exposing the electrode 118. In the present embodiment, the second CMP process and the CMP process described above for forming the conductive layer 140 and the barrier layer 142 may be the same process. In addition, after performing the second CMP process, the height of the dielectric layer 132 in the embedded memory region R1 and the height of the dielectric layer 132 in the device region R2 may be the same.

Based on the above embodiment, in the above-mentioned manufacturing method of the eMRAM, the first CMP process is performed by using the metal nitride layer 134 as the stop layer, the etch back process for exposing the dielectric layer 132 is performed, and the second CMP process for exposing the electrode 118 is performed, so that the manufacturing method of the eMRAM can have a better planarization effect.

In summary, the manufacturing method of the eMRAM of the aforementioned embodiments includes the first CMP process, the etch back process, and the second CMP process, so that a better planarization effect can be obtained.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A method of manufacturing an embedded magnetoresistive random access memory (eMRAM), comprising:
   forming a memory cell stack structure on a substrate structure, wherein the memory cell stack structure comprises:
   a first electrode located on the substrate structure;
   a second electrode located on the first electrode; and
   a magnetic tunnel junction (MTJ) structure located between the first electrode and the second electrode;
   forming a first dielectric layer covering the memory cell stack structure;
   forming a metal nitride layer on the first dielectric layer;
   forming a second dielectric layer on the metal nitride layer;
   performing a first chemical mechanical polishing (CMP) process on the second dielectric layer to expose the metal nitride layer by using the metal nitride layer as a stop layer;
   performing an etch back process to completely remove the metal nitride layer and expose the first dielectric layer; and
   performing a second CMP process to expose the second electrode, wherein an embedded memory region and a device region adjacent to each other are defined in the substrate structure, the memory cell stack structure is located in the embedded memory region, and
   before performing the first CMP process,
   a height of the first dielectric layer in the embedded memory region is higher than a height of the first dielectric layer in the device region,
   a height of the metal nitride layer in the embedded memory region is higher than a height of the metal nitride layer in the device region, and
   a height of the second dielectric layer in the embedded memory region is higher than a height of the second dielectric layer in the device region.

2. The method of manufacturing the eMRAM according to claim 1, wherein the etch back process comprises a dry etching process with no selectivity.

3. The method of manufacturing the eMRAM according to claim 1, wherein the memory cell stack structure further comprises:
   a seed layer located between the first electrode and the MTJ structure.

4. The method of manufacturing the eMRAM according to claim 1, wherein the memory cell stack structure further comprises:
   a barrier layer located between the first electrode and the substrate structure.

5. The method of manufacturing the eMRAM according to claim 1, further comprising:
   forming a passivation layer covering the memory cell stack structure before forming the first dielectric layer.

6. The method of manufacturing the eMRAM according to claim 1, wherein a dielectric constant of the first dielectric layer and a dielectric constant of the second dielectric layer are different.

7. The method of manufacturing the eMRAM according to claim 1, wherein a material of the metal nitride layer comprises titanium nitride (TiN) or tantalum nitride (TaN).

8. The method of manufacturing the eMRAM according to claim 1, wherein a material of the second dielectric layer comprises a tetraethoxysilane (TEOS) oxide.

9. The method of manufacturing the eMRAM according to claim 1, further comprising:
   performing a wet cleaning process after performing the first CMP process and before performing the etch back process.

10. The method of manufacturing the eMRAM according to claim 9, wherein a cleaning solution of the wet cleaning process comprises ultra-dilute hydrofluoric acid (UDHF).

11. The method of manufacturing the eMRAM according to claim 1, further comprising:
    performing a wet cleaning process after performing the etch back process.

12. The method of manufacturing the eMRAM according to claim 11, wherein a cleaning solution of the wet cleaning process comprises UDHF.

13. The method of manufacturing the eMRAM according to claim 1, wherein after performing the first CMP process,
    the height of the metal nitride layer in the embedded memory region is higher than the height of the metal nitride layer in the device region,
    the metal nitride layer in the embedded memory region is exposed, and
    a portion of the second dielectric layer remains on the metal nitride layer in the device region.

14. The method of manufacturing the eMRAM according to claim 13, wherein the etch back process further removes the second dielectric layer remaining on the metal nitride layer and further removes a portion of the first dielectric layer.

15. The method of manufacturing the eMRAM according to claim 13, wherein after performing the etch back process, the height of the first dielectric layer in the embedded memory region and the height of the first dielectric layer in the device region are the same.

16. The method of manufacturing the eMRAM according to claim 15, wherein after performing the second CMP process, the height of the first dielectric layer in the embedded memory region and the height of the first dielectric layer in the device region are the same.

\* \* \* \* \*